US009291920B2

(12) United States Patent
Manka et al.

(10) Patent No.: US 9,291,920 B2
(45) Date of Patent: Mar. 22, 2016

(54) FOCUS RECIPE DETERMINATION FOR A LITHOGRAPHIC SCANNER

(71) Applicant: KLA-Tencor Corporation, Milpitas, CA (US)

(72) Inventors: James Manka, Sunnyvale, CA (US); David Tien, Santa Clara, CA (US); Christian Sparka, Dresden (DE)

(73) Assignee: KLA-Tencor Corporation, Milpitas, CA (US)

( * ) Notice: Subject to any disclaimer, the term of this patent is extended or adjusted under 35 U.S.C. 154(b) by 127 days.

(21) Appl. No.: 14/015,155

(22) Filed: Aug. 30, 2013

(65) Prior Publication Data

US 2014/0063478 A1 Mar. 6, 2014

Related U.S. Application Data

(60) Provisional application No. 61/697,588, filed on Sep. 6, 2012.

(51) Int. Cl.
*G03F 9/00* (2006.01)
*G03F 7/20* (2006.01)

(52) U.S. Cl.
CPC .......... *G03F 9/7026* (2013.01); *G03F 7/70641* (2013.01); *G03F 9/7019* (2013.01); *G03F 7/70433* (2013.01)

(58) Field of Classification Search
CPC . G03F 7/70433; G03F 7/70641; G03F 7/705; G03F 9/7026; G03F 7/70525; G03F 7/70516; G03F 7/7085; G03F 7/70483; G03F 7/70725; G03F 7/70491; H01L 21/0274; H01L 22/20
See application file for complete search history.

(56) References Cited

U.S. PATENT DOCUMENTS 5,362,585 A * 11/1994 Adams ............................ 430/30
7,440,083 B2 10/2008 Rosenbluth
7,853,920 B2 12/2010 Preil et al.

FOREIGN PATENT DOCUMENTS

EP 1920369 A2 5/2008
(Continued)

OTHER PUBLICATIONS

T.A. Brunner et al., Focus and dose characterization of immersion photoclusters. http://144.206.159.178/FT/CONF/16429451/16429476.pdf. Proc. of SPIE vol. 7274, Optical Microlithography, Mar. 16, 2009, © 2009 SPIE.
(Continued)

*Primary Examiner* — Peter B Kim
*Assistant Examiner* — Michelle Iacoletti
(74) *Attorney, Agent, or Firm* — Suiter Swantz pc llo

(57) ABSTRACT

The present disclosure is directed to a method of determining one or more focus values for a lithographic scanner. An optical signal including at least a first variable and a second variable is detected by an optical analysis system from at least one test sample for a plurality of programmed focus error values. A first variable value showing sensitivity to focus is selected based upon a corresponding responsiveness of the second variable to change of focus and/or a corresponding linearity of raw focus with respect to the programmed focus error. At least one focus value for the lithographic scanner is determined based upon at least one determined raw focus value corresponding to the selected first variable value.

20 Claims, 6 Drawing Sheets

(56) References Cited

FOREIGN PATENT DOCUMENTS

| EP | 1927893 A2 | 6/2008 |
| EP | 1709490 A4 | 8/2010 |
| WO | 03001297 A3 | 1/2003 |

OTHER PUBLICATIONS

Kevin Lensing et al., Lithography Process Control Using Scatterometry Metrology and Semi-Physical Modeling. Http://jason.thecains.org/doc/spie_ml_6518_3.PDF. Proc. of SPIE vol. 6518, 651804, Apr. 4, 2007.

* cited by examiner

FOCUS RECIPE DETERMINATION FOR A LITHOGRAPHIC SCANNER

PRIORITY

The present application claims priority to U.S. Provisional Application Ser. No. 61/697,588, entitled QUANTIFYING LITHOGRAPHIC SCANNER RECIPE BEST FOCUS FROM DIRECT ANALYSIS OF SCATTEROMETRY TOOL RAW DATA COLLECTED FROM ARBITRARY PATTERNS ON FOCUS AND EXPOSURE MATRIX WAFER, By James Manka et al., filed Sep. 6, 2012, which is currently co-pending, or is an application of which currently co-pending application(s) are entitled to the benefit of the filing date. The above-referenced provisional application is hereby incorporated by reference in its entirety.

TECHNICAL FIELD

The present disclosure generally relates to the field of lithography and more particularly to methods of focusing lithography systems.

BACKGROUND

Optical analysis systems, such as reflectometers, scatterometers, ellipsometers, and the like, are used in lithographic applications to analyze process layers or features of semiconductor wafers, masks, or other device structures. A lithographic scanner may be operated according to an established recipe with a selected focus value for each process layer to achieve a desired pattern performance in a resulting device structure. A focus/exposure matrix (FEM) test wafer may be used to establish focus values for the scanner recipe.

In an existing method the FEM test wafer is exposed using a production reticle and one or more wafers including significant pattern overlap across layers (i.e. short loop or full stack). A collection of critical dimension (CD) structure features in the device pattern are selected for measurement via a critical dimension scanning electron microscope (CDSEM). Patterns are measured for combinations of focus and exposure in the FEM. Data is plotted as CD versus focus, with data series by exposure. A focus value is then selected according to dimensional requirements of the set of features.

There are some problems, however, in relying on a CDSEM-based method of determining focus. For example, CDSEM throughput is generally low. CDSEM signal-to-noise ratio (SNR) degrades rapidly as CD structure size decreases. CDSEM equipment is complex, prone to recipe setup errors, and has many possible sources of uncertainty. CDSEM beams cause resist structure size to change with repeated bombardment, thereby adding uncertainty to measurements and requiring rigorous control over measurement sequence and repetition.

According to another existing method, a test target design is selected that is expected to have sensitivity of one or more CD structure parameters (e.g. line width, sidewall angle) to scanner focus change. A computing system generates a library of simulated signals, using material properties (e.g. n and k of resist, antireflective coatings, planarization films), nominal test target structure (e.g. line width, sidewall angle, line height), reasonable expected range of target structure variation, and optical analysis parameters (e.g. wavelength range, azimuth angle range, angle of incidence range, polarizations). An FEM test wafer is exposed and signals are collected from test targets for combinations of focus and exposure in the FEM. The closest match for each signal is found in the library. Corresponding structure parameters (e.g. line width, sidewall angle, line height) for the library matches are matched up with the programmed focus and exposure combinations from the FEM. Structure parameter(s) versus focus and exposure are then analyzed to determine the extents of a "combined process window". A focus value for the scanner recipe may then be determined as the focus corresponding to the center of the process window.

The foregoing method is also burdened by various limitations. For example, library generation requires target design to be a simple repeating structure (line/space grating over unpatterned film stacks). Accordingly, the useable targets are generally limited to proxy targets in a wafer scribe area. Device structure cannot be used unless it can be modeled as a simple repeating structure on unpatterned film stacks, which is typically only possible on the very first pattern layer on memory devices. Modeling for library generation assumes structure can be represented reliably by simple trapezoidal cross-section models. Real structure profiles, however, often take on more complex shapes at focus and exposure combinations near the extents of the process window.

SUMMARY

There is a need for improved focus recipe determination techniques to overcome existing deficiencies in the art. The present disclosure is generally directed to a method of analyzing signals detected from a test sample, such as a focus/exposure matrix (FEM) test wafer, to determine one or more focus values for the scanner recipe.

In one aspect, the disclosure is directed to a method of determining at least one focus value for a lithographic scanner including at least the steps of: illuminating at least one test sample; detecting illumination reflected, scattered, or radiated from the at least one test sample for a plurality of programmed focus error values, the detected illumination exhibiting at least a first variable and a second variable; determining, for each programmed focus error value, a plurality of second variable values corresponding to a plurality of first variable values based upon illumination detected at a plurality of specified focus offsets; selecting a first variable value at least partially based upon a corresponding responsiveness of the second variable to the plurality of specified focus offsets; and determining at least one focus value based upon at least one determined raw focus value corresponding to the selected first variable value.

In another aspect, the disclosure is directed to a method of determining at least one focus value for a lithographic scanner based upon responsiveness to change of focus and linearity of the focus response. In some embodiments, for example, the method may include the steps of: analyzing responsiveness of the second variable to change of focus at a plurality of first variable values for each programmed focus error value; analyzing linearity of raw focus with respect to programmed focus error at the plurality of first variable values; and selecting a first variable value based upon a corresponding responsiveness of the second variable to change of focus and a corresponding linearity of raw focus with respect to the programmed focus error.

In yet another aspect, the disclosure is directed to an optical analysis system embodying one or more of the methods described herein. The optical analysis system may include at least one illumination source configured to illuminate a test sample. The optical analysis system may further include at least one detector configured to receive illumination reflected, scattered, or radiated from the sample along an optical path including projection optics. A computing system in communication with the at least one detector may be configured to: determine, for each programmed focus error value, a plurality of second variable values corresponding to a plurality of first variable values based upon illumination detected at a plurality of specified focus offsets; select a first variable value at least partially based upon a corresponding responsiveness of the second variable to the plurality of specified focus offsets; and determine at least one focus value based upon at least one determined raw focus value corresponding to the selected first variable value.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

FIGS. 1 through 4 generally illustrate a system and method for determining one or more focus values for a lithographic scanner, such as the photolithographic systems discussed in Patent Publication WO 2003001297 which is hereby incorporated by reference in its entirety. Various embodiments include a method of analyzing raw data (i.e. optical signals) collected from a test sample, such as a focus/exposure matrix (FEM) wafer. Among other advantages, the method requires no changes to optics or hardware of an optical analysis system, such as a scatterometer, reflectometer, ellipsometer, inspection system, or any other metrology or imaging system known to the art. It is noted, however, that optics changes may be desirable in some embodiments to increase sensitivity or other performance criteria.

According to various embodiments, a first variable A is an independent parameter. For example, variable A may include wavelength, azimuth angle, angle of incidence, incident and/or collection polarization, or any other controlled or predetermined parameter of an optical analysis system. A second variable B may be a function of the measured signal (i.e. a dependent parameter). For example, variable B may include percent reflectance, alpha and beta parameters, some norm (e.g. L2-norm) of the signal vector or of the vector of the differentials (as a function of pupil coordinates and/or wave lengths), or any other measured parameter that is at least partially influenced by changing variable A. After collecting measurements from combinations of focus and exposure, it is possible to identify some value(s) or range(s) of variable A where variable B exhibits a strong response to change in scanner focus and/or where the raw focus is substantially linear with respect to programmed focus error. Accordingly, the identified value or range of variable A may be selected for focus recipe determination, as will be discussed in further detail below.

Figure 1:
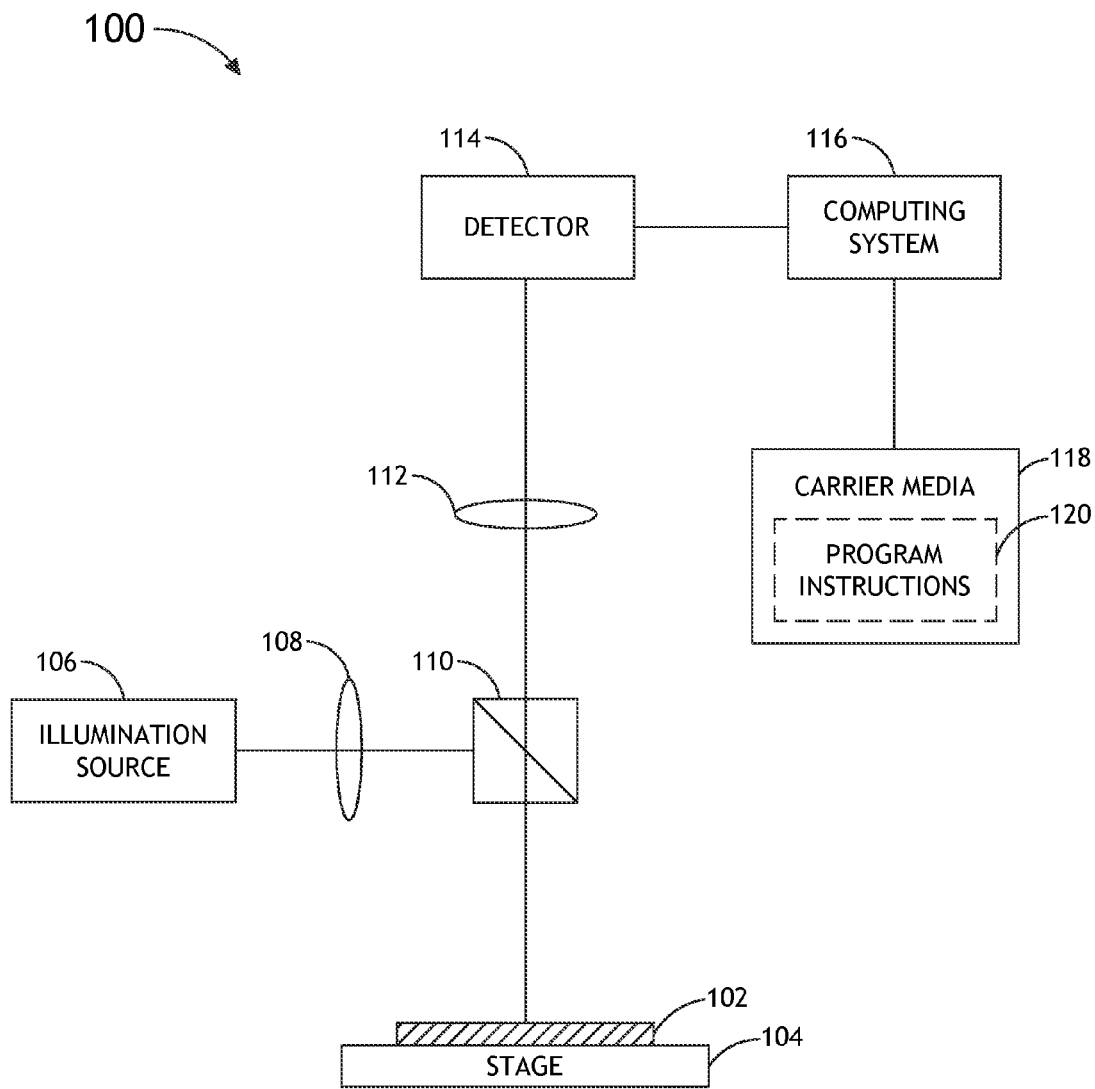
FIG. 1 is a block diagram illustrating a system for analyzing at least one sample, in accordance with an embodiment of this disclosure.

FIG. 1 illustrates an embodiment of an optical analysis system 100 which may be configured to determine one or more focus values for a lithographic scanner via one or more of the methods described herein. The system 100 may include any system configured to perform measurements by detecting illumination reflected, scattered, and/or radiated from a surface of a sample 102, such as a semiconductor wafer, mask, or any other artifact. For example, the system 100 may include a scatterometer, reflectometer, ellipsometer, inspection system, or any other metrology or imaging system known to the art. Further, it should be clear to those skilled in the art that the embodiment shown in FIG. 1 is provided for illustrative purposes and is not intended to limit the system 100 to a particular selection or configuration of components.

According to various embodiments, the system 100 may include a stage 104 configured to support the sample 102. In some embodiments, the stage 104 is further configured to actuate the sample 102 to a selected position or orientation. For example, the stage 104 may include or may be mechanically coupled to at least one actuator, such as a motor or servo, configured to translate or rotate the sample 102 for positioning, focusing, and/or scanning in accordance with a selected inspection or metrology algorithm, several of which are known to the art.

The system 100 may further include at least one illumination source 106 configured to provide illumination along an illumination path delineated by one or more illumination optics 108 to a surface of the sample 102. In some embodiments, the illumination path further includes a beam splitter 110 configured to direct at least a portion of the illumination to the surface of the sample 102. The beam splitter 110 may be further configured to direct illumination reflected, scattered, or radiated from the surface of the sample 102 along a collection path delineated by one or more collection optics 112 to at least one detector 114, such as a camera (e.g. CCD or CMOS camera), photodiode, or any other photodetector or imaging array. As used herein, the terms illumination optics and collection optics include any combination of optical elements such as, but not limited to, focusing lenses, diffractive elements, polarizing elements, optical fibers, and the like.

Although not illustrated in FIG. 1, instead of joining the illumination path and the collection path through a beam splitter 110, some embodiments of the system 100 may be configured to illuminate the sample 102 from a first angle and collect illumination reflected, scattered, or radiated by the sample 102 at a second angle. For example, the illumination optics 108 may be configured to directly deliver illumination to the sample 102 from a first direction at a selected angle. Similarly, the collection optics 112 may be configured to receive illumination reflected, scattered, or radiated from the sample 102 at a corresponding angle. Additional variations to the architecture of system 100 may be made without departing from the scope of this disclosure.

The system 100 may further include at least one computing system 116 communicatively coupled to the detector 114. The computing system 116 may include, but is not limited to, a personal computing system, mainframe computing system, workstation, image computer, parallel processor, or any processing device known in the art. In general, the term "computing system" may be broadly defined to encompass any device having one or more processors configured to execute program instructions 120 from at least one carrier medium 118. Communicative coupling may refer to either directly attached communication, wired or wireless networking, or data transmission via physical transfer of portable storage media (e.g. flash drive) carrying detected information from a first computing system 116 directly coupled to the detector 114 to a second computing system 116 for analysis.

The computing system 116 may be configured to receive information (e.g. reflectance signals, alpha and beta signals, image frames, pixels, intensity measurements, or any other raw data signals) associated with illumination collected by the detector 114. The computing system 116 may be further configured to carry out various inspection algorithms, metrology algorithms, and/or any other sample analysis algorithms known to the art utilizing the collected information. For example, the computing system 116 may be configured to determine at least one spatial or physical attribute of the sample 102, such as defect size, layer thickness, feature size, trench spacing, overlay misalignment, and the like. The computing system 116 may be further configured to execute or control execution of various steps, functions, or operations described herein. For example, carrier media 118 may include embedded program instructions 120 for executing one or more steps of the methods described herein, such as methods 200 and 400 discussed below.

Figure 2:
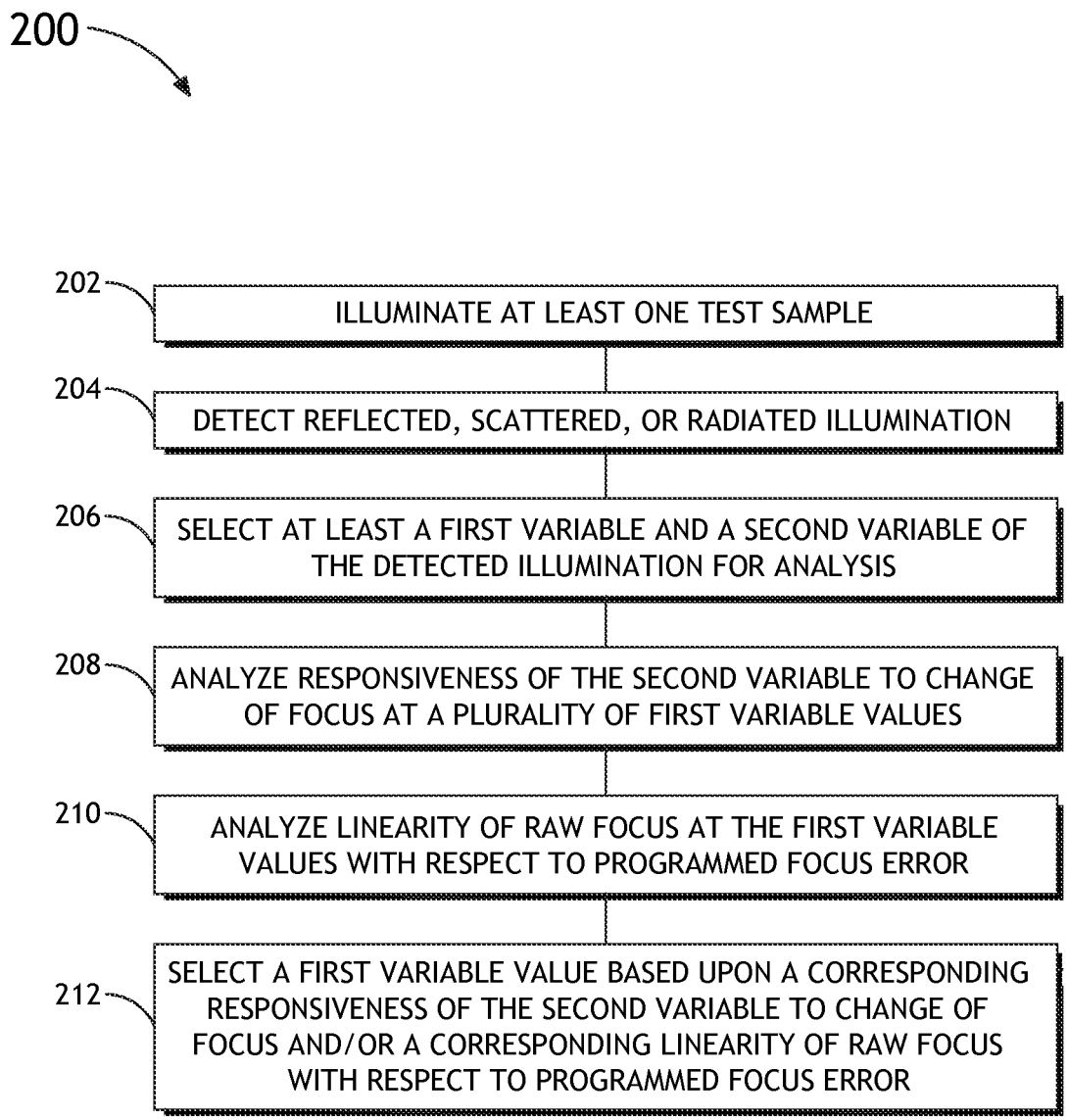
FIG. 2 is a flow diagram illustrating a method of determining at least one focus value for a lithographic scanner, in accordance with an embodiment of this disclosure.

FIG. 2 is a flow diagram illustrating an embodiment of a method 200 of determining one or more focus values for a lithographic scanner. In some embodiments, the method 200 may be performed utilizing system 100 to determine an instant raw focus or a plurality of raw focus values to establish a focus recipe for performing lithography on a plurality of device layers or features of a sample. It is noted that the method 200 may be manifested by an embodiment of system 100 or any other system configured to perform one or more of the following steps. Additionally, reference will be made to an exemplary embodiment illustrated by FIGS. 3A through 3C; however, the method 200 is in no way restricted to the variables, ranges, or values illustrated in FIGS. 3A through 3C.

Referring now to steps 202 and 204, measurements are performed at a plurality of focus/exposure combinations by illuminating at least one test sample, such as an FEM wafer or another patterned sample structure. Illumination reflected, scattered, and/or radiated from the test sample is detected to collect raw data signals exhibiting at least one independent variable and at least one dependent variable. Signals are accordingly detected for a plurality of specified focus offsets and a plurality of programmed focus error values (i.e. multiple FEMs).

Figure 3A:
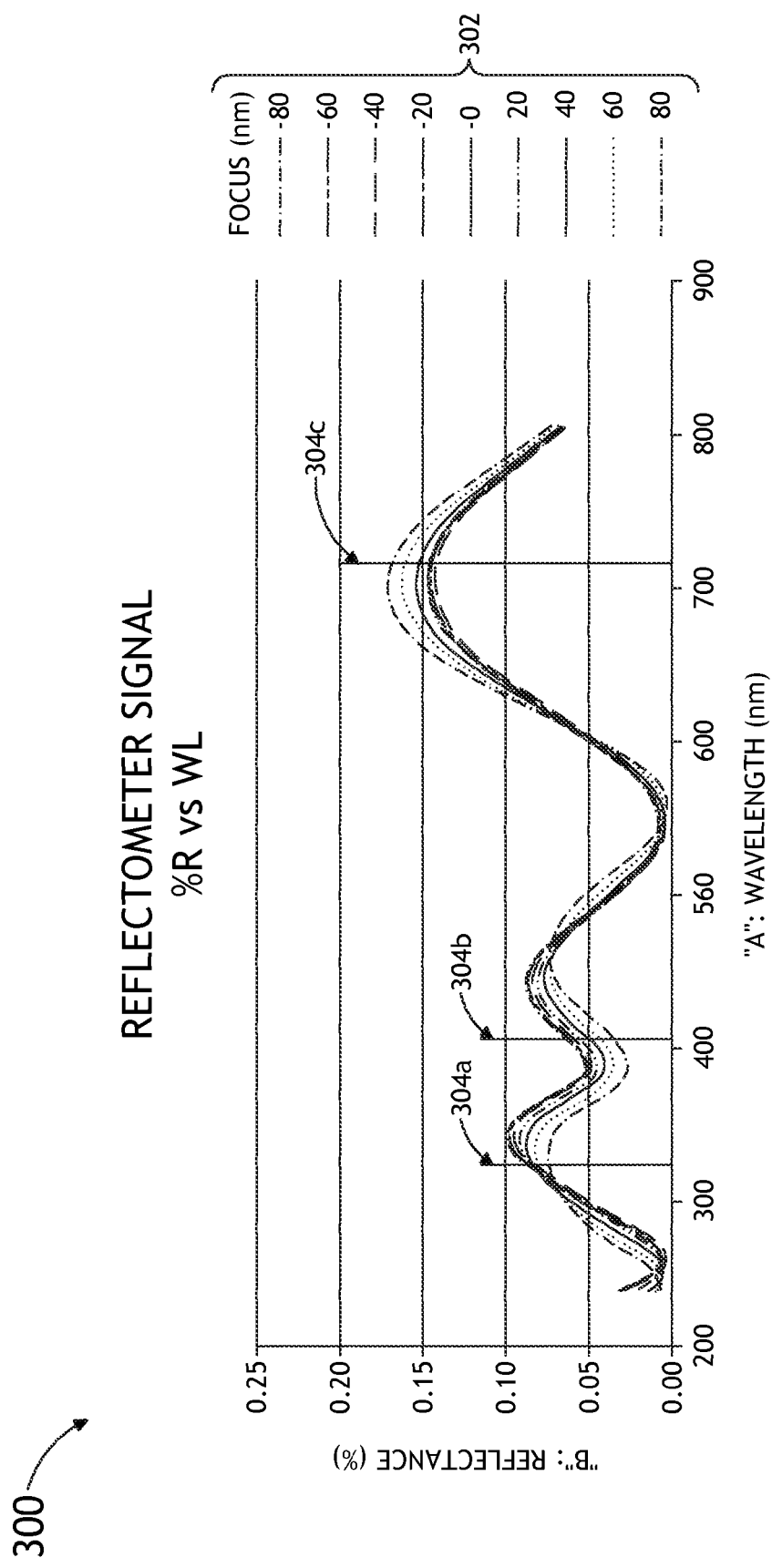
FIG. 3A is a graphical representation of a second variable plotted as a function of a first variable for a plurality of specified focus offsets, in accordance with an embodiment of this disclosure.
Figure 3B:
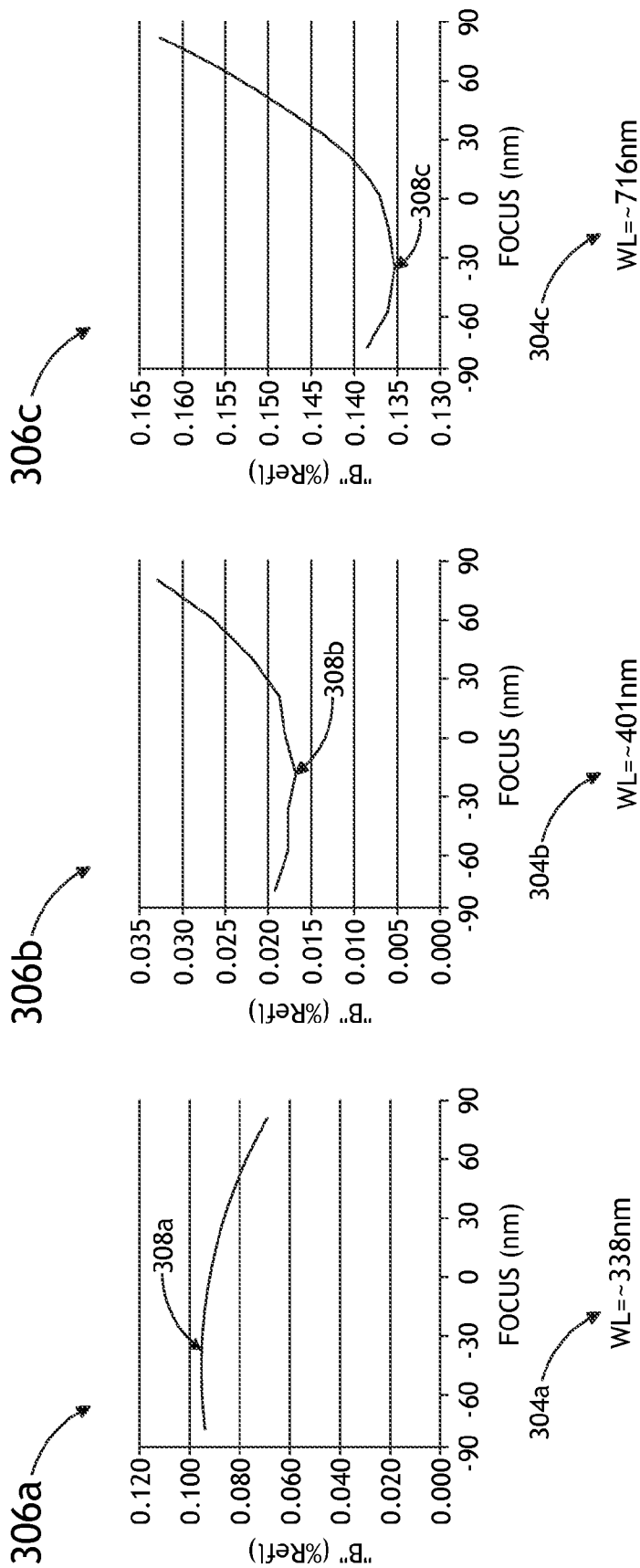
FIG. 3B includes graphical representations of the second variable plotted as a function of focus for particular first variable values, in accordance with an embodiment of this disclosure.
Figure 3C:
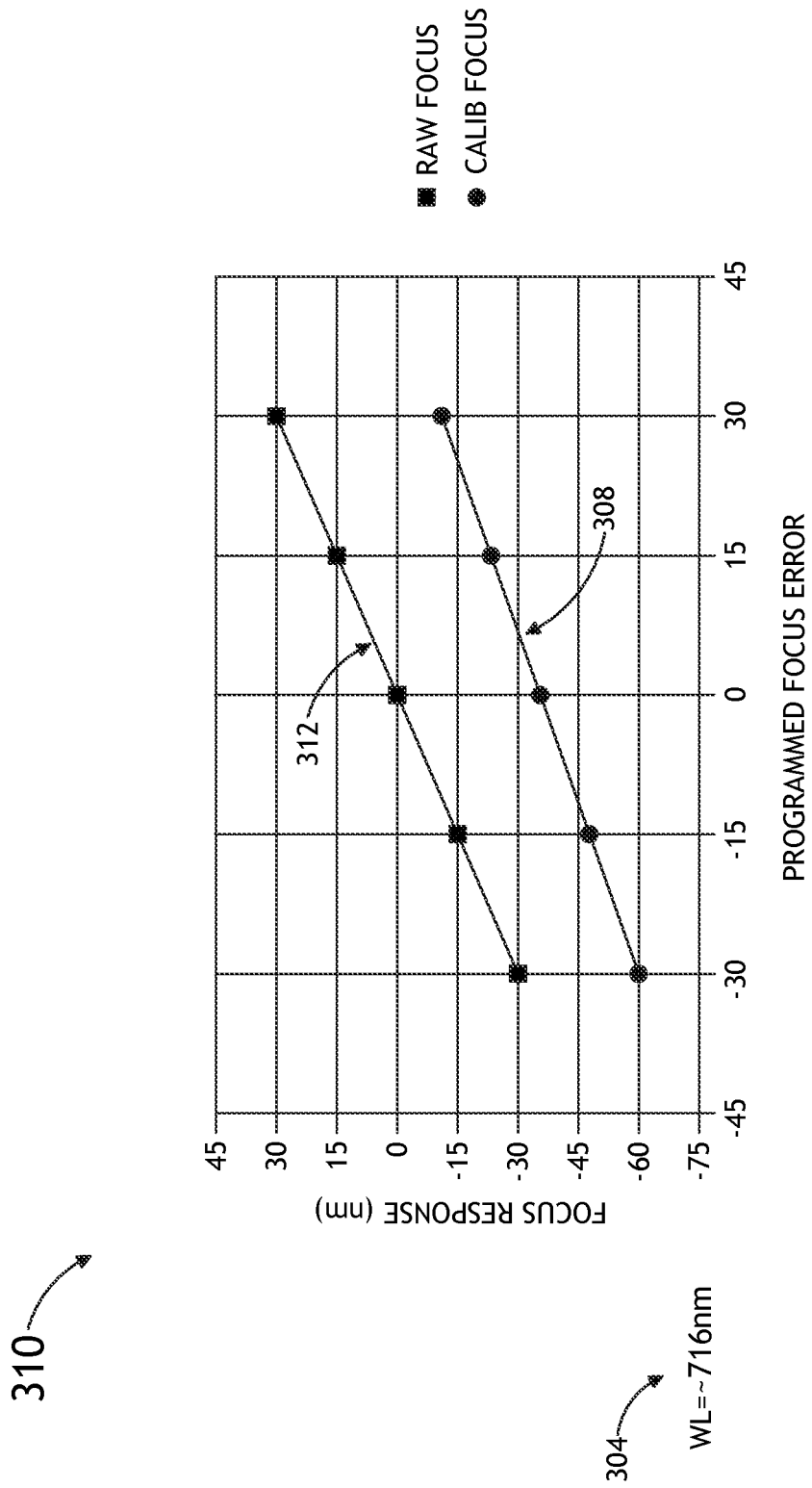
FIG. 3C is a graphical representation of raw focus and calibrated focus plotted as a function of programmed focus error for a particular first variable value, in accordance with an embodiment of this disclosure.

At step 206, at least one first variable A and at least one second variable B are selected for analysis. The variables may be selected based upon a correlation between variable A and variable B. For example, variable A may be an independent variable having a strong influence on a measured (dependent) variable B with respect to scanner focus. In the exemplary embodiment of FIG. 3A, for instance, variable A may be wavelength and variable B may be percent reflectance. As can be seen in chart 300, the response of variable B to different focus offsets 302 is significantly affected by variable A. The exemplary embodiment illustrated by FIGS. 3A through 3C is directed to analysis of reflectometer signals. Variables A and B may include alternative variable selections depending upon the type of optical analysis system, sample structure, or raw data signals being detected.

At step 208, the response of variable B to different focus offsets 302 is compared at a plurality of different values of variable A to determine one or more values (e.g. values 304a, 304b, and 304c) or ranges of variable A where variable B exhibits a strong response. This analysis may be repeated for each one of a plurality of programmed focus errors (e.g. five FEMs). For example, at each programmed focus error, values of variable B corresponding to different focus offsets 302 may be determined for each value of variable A. Chart 300 graphically represents the variable B plotted as a function of variable A for each one of a plurality of different focus offsets 302 for a single programmed focus error (i.e. one FEM). A plurality of charts 300, one for each programmed focus error, could be used to graphically represent the repeated analysis.

At step 210, the linearity of raw focus with respect to programmed focus error may be compared at a plurality of different values of variable A to determine one or more values (e.g. values 304a, 304b, and 304c) or ranges of variable A where the raw focus is substantially linear as a function of programmed focus error. The exemplary embodiment is continued in FIG. 3B, showing charts 306a, 306b, and 306c corresponding to values 304a, 304b, and 304c of variable A. The charts 306 graphically represent variable B analyzed as a function of focus (i.e. plotted according to the plurality of specified focus offsets 302) for a plurality of values 304 of variable A. The raw focus (e.g. values 308a, 308b, and 308c) for each value 304 of variable A may be determined according to a local minimum or maximum of the response of variable B with respect to focus. This analysis may be repeated for each programmed focus error to determine a plurality of raw focus values corresponding to a plurality of programmed focus error values at each one of a plurality of values or ranges of variable A. As shown in FIG. 3C, one or more values 304 of variable A may demonstrate a substantially linear focus response with respect to programmed focus error. For example, chart 310 graphically represents the raw focus 308 corresponding to a value 304 of variable A plotted as a function of programmed focus error, wherein the raw focus 308 is substantially parallel with a (theoretical) calibrated focus response 312.

At step 212, at least one value or range of variable A is selected at least based upon a corresponding responsiveness of variable B to change of scanner focus. In some embodiments, for example, the method 200 may proceed directly from step 208 to step 212 without necessarily analyzing linearity of raw focus for different values of variable A across a plurality of programmed error values. In further embodiments, both responsiveness to change of focus and linearity of the focus response are taken into consideration. For example, the value or range of variable A selected for focus value determination may exhibit a relatively strong corresponding responsiveness of variable B to change of focus and a substantial linearity of raw focus with respect to programmed focus error.

In some embodiments, a lithographic scanner is focused according to an instant raw focus corresponding to the selected value or range of variable A. Alternatively, the raw focus corresponding to the selected value or range of variable A is stored and subsequently used to determine a focus of the lithographic scanner. When raw focus is determined at a plurality of programmed focus error values (e.g. several FEMs), raw focus values corresponding to the plurality of programmed focus error values may be stored as discrete values or as a substantially linear fit. The stored focus values corresponding to the selected value or range of variable A may be used to establish a focus recipe for performing lithography on a plurality of sample features or layers (having different optimal focus settings). A lithographic scanner is accordingly enabled to perform lithography on complex or multi-layer samples with improved focus settings. For example, projection optics of a lithographic scanner may be mechanically and/or digitally focused according to the established focus recipe.

In some embodiments, a range of variable A values is used instead of a single value to improve precision determination. Precision may be determined by measuring a sample structure a selected number of times and comparing the resulting focus response signals. For example, a three-sigma analysis may be employed to determine the precision of focus values determined according to a selected value of variable A. Since other values in close proximity will generate a similar response, it is possible to produce a more accurate precision determination by running the same analysis for a range of variable A around the selected value. Furthermore, a more robust focus recipe with reduced error may be established utilizing the range of variable A values.

Figure 4:
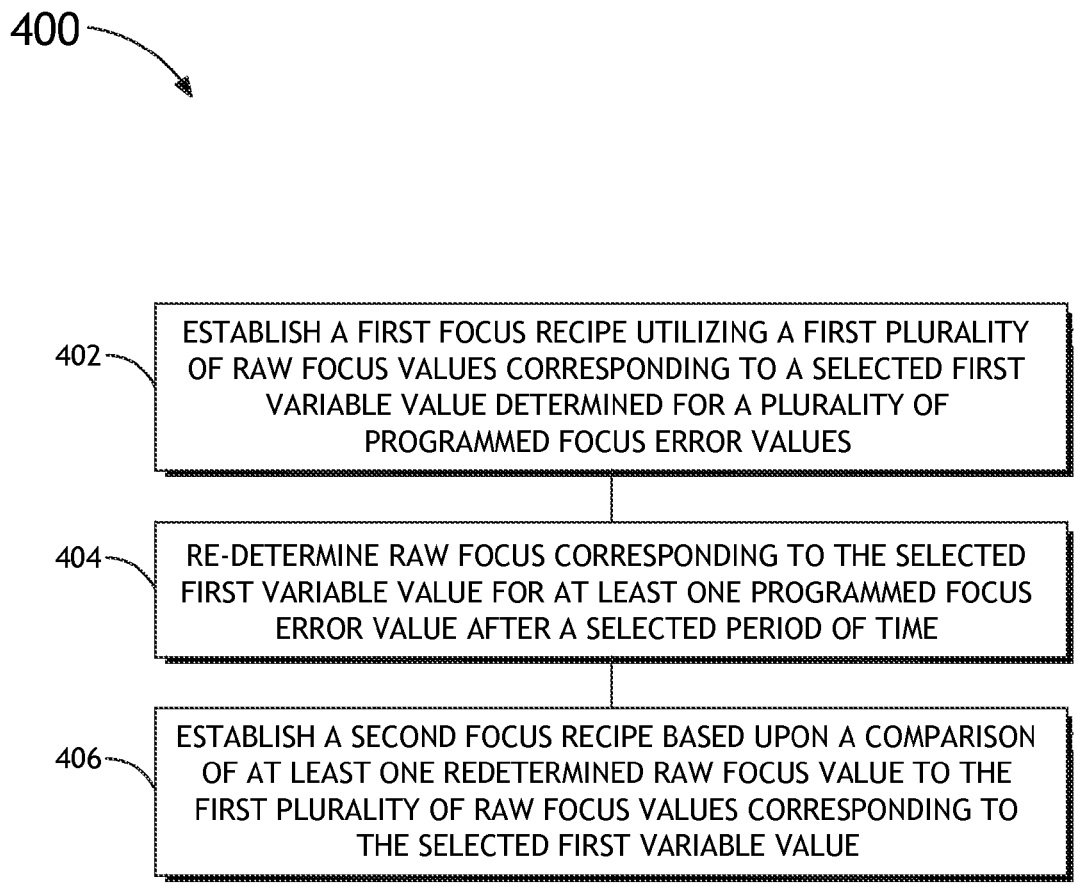
FIG. 4 is a flow diagram illustrating a method of recalibrating a lithographic scanner recipe, in accordance with an embodiment of this disclosure.

FIG. 4 illustrates a method 400 establishing recalibrating a focus recipe for a lithographic scanner. At step 402, a first focus recipe is established according to raw focus values corresponding to a plurality of programmed focus error values for a selected value or range of variable A. For example, the focus recipe may be established via an embodiment of method 200 described herein. The first focus recipe is utilized to perform an initial calibration (i.e. focusing) of the lithographic scanner. Thereafter a lithographic scanner may be defocused due to various occurrences of continued use, such as repositioning or wearing of projection optics. Accordingly, the focus recipe may need to be recalibrated over time.

As illustrated by steps 404 and 406, the lithographic scanner may be recalibrated by simply updating the established focus recipe (i.e. establishing a second focus recipe based upon the first focus recipe). At step 404, a raw focus value corresponding to the selected value or range of variable A may be re-determined for at least one programmed focus error value (i.e. one FEM). It is noted that the programmed focus error value may include zero or no programmed focus error. The re-determined (second) raw focus value is compared against the stored (first) raw focus values to determine a drift of focus from the calibrated response. At step 406, a second focus recipe may be established by updating the first established focus recipe to compensate for the determined drift of focus. As such, the lithographic scanner may be recalibrated as desired or according to a fixed schedule or predetermined time intervals.

The method described herein offers several advantages. For example, there is no need to select critical dimensions for process window analysis. Optical analysis systems, such as scatterometers, are typically faster than CDSEM and non-destructive (i.e. no resist charging). Further, scatterometers have large spot size, minimizing uncertainty from CD "hot spots" caused by reticle manufacture errors, OPC rule errors, and the like. Additionally, there is no need to carefully characterize material n and k, design a nominal structure model, generate a library of simulated spectra signals, and perform a process window analysis. The method allows for insulation of customer IP because details of film stack composition, structure design, and other parameters do not need to be known. The method is self-calibrating because values or ranges of variable A with high sensitivity to change of focus can be identified automatically. More direct data-to-decision utilizing few variables reduces total uncertainty. Furthermore, the method described herein may be used on complex device pattern areas that cannot be modeled via library-based techniques, thereby eliminating the need for proxy targets in a wafer scribe.

Those having skill in the art will further appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. Program instructions implementing methods such as those described herein may be transmitted over or stored on carrier media. A carrier medium may include a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. A method of determining at least one focus value for a lithographic scanner, comprising:
    illuminating at least one test sample;
    detecting illumination reflected, scattered, or radiated from the at least one test sample for a plurality of programmed focus error values, the detected illumination exhibiting at least a first variable and a second variable;
    determining, for each programmed focus error value, a plurality of second variable values corresponding to a plurality of first variable values based upon illumination detected at a plurality of specified focus offsets;
    selecting a first variable value at least partially based upon a corresponding responsiveness of the second variable to the plurality of specified focus offsets; and
    determining at least one focus value based upon at least one determined raw focus value corresponding to the selected first variable value.

2. The method of claim 1, further comprising:
    determining, for each programmed focus error value, a plurality of raw focus values corresponding to the plurality of first variable values based upon the corresponding plurality of second variable values and the plurality of specified focus offsets.

3. The method of claim 2, further comprising:
selecting the first variable value at least partially based upon a corresponding linearity of the raw focus with respect to the programmed focus error values.

4. The method of claim 1, wherein the first variable comprises an independent variable.

5. The method of claim 4, wherein the independent variable comprises wavelength, azimuth angle, angle of incidence, or polarization.

6. The method of claim 1, wherein the second variable comprises a dependent variable.

7. The method of claim 6, wherein the dependent variable comprises percent reflectance, alpha and beta parameters, norm of a signal vector, or norm of a differential vector.

8. The method of claim 1, further comprising:
storing the raw focus value corresponding to the selected first variable value for each programmed focus error value; and
establishing a focus recipe based upon the stored raw focus values.

9. The method of claim 8, further comprising:
determining at least a second raw focus value corresponding to the selected first variable value at a second point in time; and
updating the focus recipe based upon a comparison of the second raw focus value and the stored raw focus values.

10. A system for determining at least one focus value for a lithographic scanner, comprising:
a stage configured to support at least one test sample;
at least one illumination source configured to illuminate the at least one test sample;
at least one detector configured to receive illumination reflected, scattered, or radiated from the at least one test sample for a plurality of programmed focus error values, the detected illumination exhibiting at least a first variable and a second variable; and
a computing system communicatively coupled to the at least one detector, the computing system being configured to:
determine, for each programmed focus error value, a plurality of second variable values corresponding to a plurality of first variable values based upon illumination detected at a plurality of specified focus offsets;
select a first variable value at least partially based upon a corresponding responsiveness of the second variable to the plurality of specified focus offsets; and
determine at least one focus value based upon at least one determined raw focus value corresponding to the selected first variable value.

11. The system of claim 10, wherein the computing system is further configured to:
determine, for each programmed focus error value, a plurality of raw focus values corresponding to the plurality of first variable values based upon the corresponding plurality of second variable values and the plurality of specified focus offsets.

12. The system of claim 11, wherein the computing system is further configured to:
select the first variable value at least partially based upon a corresponding linearity of the raw focus with respect to the programmed focus error values.

13. The system of claim 10, wherein the first variable comprises an independent variable including wavelength, azimuth angle, angle of incidence, or polarization.

14. The system of claim 10, wherein the second variable comprises a dependent variable including percent reflectance, alpha and beta parameters, norm of a signal vector, or norm of a differential vector.

15. The system of claim 10, wherein the at least one test sample comprises a focus/exposure matrix (FEM) test wafer.

16. The system of claim 10, wherein the computing system is further configured to:
store the raw focus value corresponding to the selected first variable value for each programmed focus error value; and
establish a focus recipe based upon the stored raw focus values.

17. The system of claim 16, wherein the computing system is further configured to:
determine at least a second raw focus value corresponding to the selected first variable value at a second point in time; and
update the focus recipe based upon a comparison of the second raw focus value and the stored raw focus values.

18. A method of determining at least one focus value for a lithographic scanner, comprising:
illuminating at least one test sample;
detecting illumination reflected, scattered, or radiated from the at least one test sample for a plurality of programmed focus error values, the detected illumination exhibiting at least a first variable and a second variable;
analyzing responsiveness of the second variable to change of focus at a plurality of first variable values for each programmed focus error value;
analyzing linearity of raw focus with respect to programmed focus error at the plurality of first variable values;
selecting a first variable value based upon a corresponding responsiveness of the second variable to change of focus and a corresponding linearity of raw focus with respect to the programmed focus error; and
determining at least one focus value based upon at least one determined raw focus value corresponding to the selected first variable value.

19. The method of claim 18, further comprising:
storing a raw focus value corresponding to the selected first variable value for each programmed focus error value; and
establishing a focus recipe based upon the stored raw focus values.

20. The method of claim 19, further comprising:
determining at least a second raw focus value corresponding to the selected first variable value at a second point in time; and
updating the focus recipe based upon a comparison of the second raw focus value and the stored raw focus values.

* * * * *